United States Patent
Platzgummer

(10) Patent No.: US 7,781,748 B2
(45) Date of Patent: Aug. 24, 2010

(54) PARTICLE-BEAM EXPOSURE APPARATUS WITH OVERALL-MODULATION OF A PATTERNED BEAM

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 207 days.

(21) Appl. No.: 12/294,262

(22) PCT Filed: Mar. 16, 2007

(86) PCT No.: PCT/AT2007/000132

§ 371 (c)(1),
(2), (4) Date: Sep. 24, 2008

(87) PCT Pub. No.: WO2007/112465

PCT Pub. Date: Oct. 11, 2007

(65) Prior Publication Data

US 2009/0200495 A1      Aug. 13, 2009

(30) Foreign Application Priority Data

Apr. 3, 2006     (AT)     ................................ A 566/2006

(51) Int. Cl.
*H01J 37/147*     (2006.01)
(52) U.S. Cl. ............................ 250/492.22; 250/492.23; 250/396 R
(58) Field of Classification Search ............. 250/492.22, 250/492.23, 396 R, 398
See application file for complete search history.

(56) References Cited

U.S. PATENT DOCUMENTS

| | | | |
|---|---|---|---|
| 5,144,142 A | 9/1992 | Fueki et al. | |
| 5,260,579 A | 11/1993 | Yasuda et al. | |
| 5,359,202 A | 10/1994 | Yasuda et al. | |
| 5,369,282 A | 11/1994 | Arai et al. | |
| 5,430,304 A | 7/1995 | Yasuda et al. | |
| 6,768,125 B2 | 7/2004 | Platzgummer et al. | |
| 7,084,414 B2 * | 8/2006 | Wieland et al. | ........ 250/492.23 |
| 7,276,714 B2 * | 10/2007 | Platzgummer et al. | . 250/492.22 |
| 2001/0013581 A1 | 8/2001 | Takemoto et al. | |

FOREIGN PATENT DOCUMENTS

| | | |
|---|---|---|
| EP | 0 335 711 A2 | 10/1989 |
| EP | 1 369 895 A2 | 12/2003 |
| WO | WO 99/57745 | 11/1999 |

OTHER PUBLICATIONS

International Search Report for PCT International Application No. PCT/AT2007/000132, mailed Aug. 6, 2007.

* cited by examiner

*Primary Examiner*—Kiet T Nguyen
(74) *Attorney, Agent, or Firm*—RatnerPrestia

(57) ABSTRACT

In a charged-particle exposure apparatus for exposure of a target with a beam of electrically charged particles, the illumination system includes a deflector device adapted to vary the direction of incidence of the illuminating beam upon the pattern definition device, the pattern definition device forms the shape of the illuminating beam into a desired pattern, and the projection optics system projects an image of the beam shape defined in the pattern definition device onto the target; the projection optics system includes a blocking aperture device having an opening and being adapted to block passage of beams traversing outside the opening, namely when the deflector device is activated to tilt the beamlet by a sufficient angle from its non-deflected path, e.g., for blanking out during the process of loading a pattern into the pattern definition device.

13 Claims, 8 Drawing Sheets

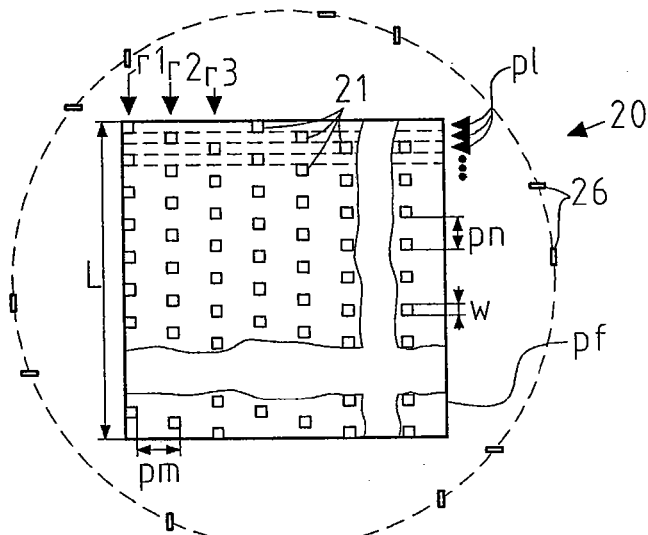
Fig. 2
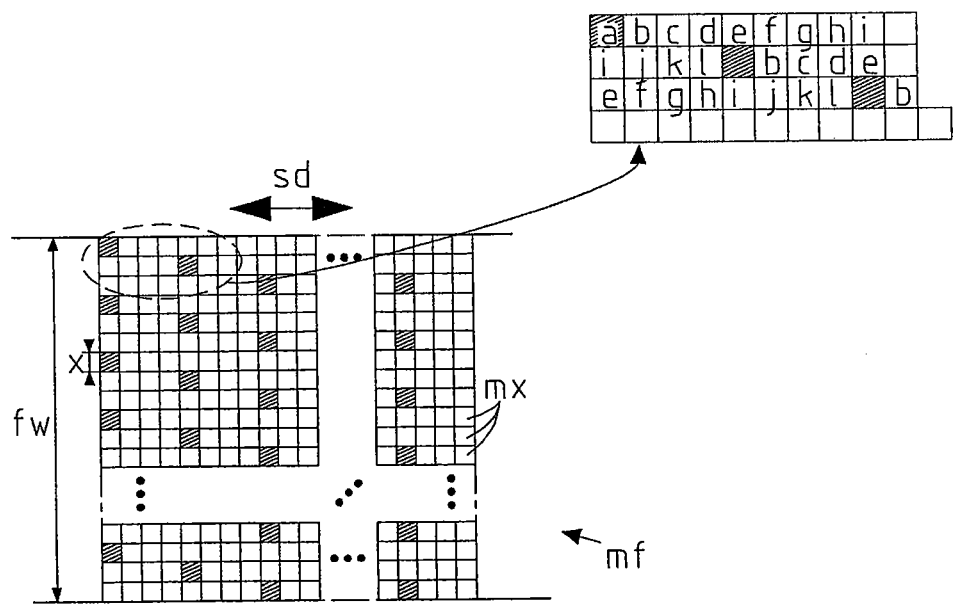
Fig. 3a
Fig. 3

PARTICLE-BEAM EXPOSURE APPARATUS WITH OVERALL-MODULATION OF A PATTERNED BEAM

This application is a U.S. National Phase Application of PCT International Application No. PCT/AT2007/000132, filed Mar. 16, 2007.

BACKGROUND

Field Of The Invention

The invention relates to improvements of a charged-particle exposure apparatus for exposure of a target with a beam of electrically charged particles.

More in detail, the invention relates to a charged-particle exposure apparatus for exposure of a target with a beam of electrically charged particles, said particle beams propagating along parallel beam paths towards the target, said apparatus comprising an illumination system, a pattern definition means and a projection optics system; the illumination system serves to produce the beam and form it into a substantially telecentric beam illuminating the pattern definition means; the pattern definition means forms the shape of the illuminating beam into a desired pattern; and the projection optics system serves to project an image of the beam shape defined in the pattern definition means onto the target. The pattern definition means comprises a plurality of apertures adapted to shape the cross-section of the illuminating beam into a multitude of beamlets, by allowing the passage of the illuminating beam only through said plurality of apertures defining the shape of beamlets permeating said apertures, and it further comprises a blanking means having a plurality of individual beamlet deflectors ("micro-deflectors") adapted to selectively divert the respective beamlets from respective nominal imaging paths.

In other words, the particle beam is generated by an illumination system, and it illuminates a pattern definition (PD) means having an array of apertures which define a beam pattern to be projected on a target surface. The passage of each beam through an aperture can be controlled by means of the corresponding micro-deflector so as to allow ('switch on') or effectively deactivate ('switch off') the passage of particles of the beam through the respective apertures onto the target. This is done, for instance, by providing an absorbing surface onto which 'switched-off' beamlets are directed and absorbed; only the non-deflected ('switched-on') beamlets can finally reach the target. The beam permeating the aperture array forms a patterned particle beam (consisting of a plurality of small, laterally restricted beams, which herein are referred to as beamlets) bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions.

One important application of a processing apparatus of this kind is in the field of nano-scale patterning, by direct ion beam material modification or ion beam induced etching and/or deposition, used for the fabrication or functionalization of nano-scale devices, particularly having sub-100 nm feature sizes. Another important application of processing apparatus of this kind is in the field of particle-beam lithography used in semiconductor technology, as a lithography apparatus, wherein, in order to define a desired pattern on a substrate surface, the wafer is covered with a layer of a radiation-sensitive photoresist, a desired structure is imaged onto the photoresist by means of a lithography apparatus which is then patterned by partial removal according to the pattern defined by the previous exposure step and then used as a mask for further structuring processes such as etching.

The potential use of an addressable aperture plate for direct pattern transfer by charged particle beam projection has been investigated since more than a decade. One early discussion is given by B. Lischke et al., Microelectronic Engineering 9, 1989, pp. 199-203. Fueki et al., U.S. Pat. No. 5,144,142, describe an electron-beam exposure system using a so-called blanking aperture array (BAA) which plays the role of the PD means of the invention. The BAA carries a number of rows of apertures, and the images of the apertures are scanned over the surface of the substrate in a controlled continuous motion whose direction is perpendicular to the aperture rows. Later, in 1997, I. L. Berry et al., in J. Vac. Sci. Technol. B, 15 (6), 1997, pp. 2382-2386, presented a writing strategy based on a BAA and an ion projection system.

Arai et al., U.S. Pat. No. 5,369,282, discuss an electron-beam exposure system using a BAA having apertures that are not arranged in a simple m×n rectangular array. Rather, the rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area to be exposed on the substrate. In the U.S. Pat. No. 5,369,282, the apertures of every second row align and the pitch between neighboring apertures in a row is twice the width of an aperture; in general, an alignment of rows is possible based on any number n, the pitch then being n times the width of an aperture. Yasuda et al., U.S. Pat. Nos. 5,430,304, 5,359,202 and 5,260,579 use a similar BAA for exposing a substrate with a pattern, but the need to fed control lines to each of the blanking apertures makes the internal structuring very complex and prone to unwanted disturbing effects such as cross-talking and transit time delays.

The above-mentioned article of I. L. Berry et al. describes a PD device comprising a "programmable aperture array" with an array of 3000×3000 apertures of 5 μm side length with an n=4 alignment of rows and staggered lines. The aperture array contains additional logic circuitry, thus implementing an electronic mask scanning system in which the pattern information is passed by means of shift registers from one aperture to the next within a row. The article proposes to use a 200× demagnification ion-optical system for imaging the apertures of the BAA onto the substrate.

Starting from Berry's concept, E. Platzgummer et al., in the U.S. Pat. No. 6,768,125 (=GB 2 389 454 A), present a multi-beam direct write concept, dubbed PML2 (short for "Projection Mask-Less Lithography #2"), employing a PD device comprising a number of plates stacked on top of the other, among them an aperture array means (aperture plate) and a blanking means (blanking plate). These separate plates are mounted together at defined distances, for instance in a casing. The aperture array means has a plurality of apertures of identical shape defining the shape of beamlets permeating said apertures, wherein the apertures are arranged within a PD field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings.

According to the PML2 concept, the image formed by the beam is moved continuously along a straight path over each die field; additional scanning of the beam in a direction perpendicular to the scanning direction is not necessary (except, where needed, to compensate for lateral travel motion errors of the scanning stage). Furthermore, gray scales can be generated by subsequent exposures of apertures located in line, so that a shift register approach can be effectively applied to create gray scale patterns (of a predetermined bit size, e.g. 5 or more bits) while only the substrate is moved. The PML2 concept involves the use of a large amount of memory on the aperture plate, located next to the apertures either in between or in the vicinity.

The key for the realization of an addressable mask is the so-called Micro-Electro and micro-Mechanical System (MEMS) technology, which allows the monolithic fabrication of hundred thousands up to millions of apertures together with the electronics needed to control the beam switching and data management. Since the minimum feature size of industrial MEMS devices is about 100 to 200 times larger than the typical critical dimension in lithography (for example the size of apertures and micro-deflectors), a powerful large field high-resolution optical projection system is obligatory for exploitation of the advanced MEMS fabrication technologies in the field fast writing applications, such as for example mask-less lithography.

The main advantage of the multi-beam approach inherent to the PLM2 is the vast enhancement of the writing speed compared to single beam writers, due to the fact that the charged particle beam comprises a plurality of sub-beams, dynamically structured by an aperture plate including switchable blanker devices. The improved productivity (over other prior art, such as Arai et al, and Yasuda et al.) arises mainly from the following features:

- the possible number of sub-beams directed parallel to the substrate and the possible density of apertures per area is significantly increased, resulting in relaxed requirements for the particle source;
- single beam blanking is achieved by a continuous data stream and a simplified data line architecture, where only one aperture row (=number of lines×one aperture) is to be fed into the PD field per clock cycle, the signal traveling by shift registers over the PD field;
- the influence of space charge is reduced since the beam current is distributed over a large cross section as a consequence of using a broad beam;
- a high degree of redundancy is produced using a large number of fractional exposures (apertures in line) to cumulate the desired exposure dose, which permits a gray scale generation during single pass scanning.

However, with the PLM2 layout, like with other prior art, the following main problems arise:

Due to the global movement between beam and substrate, which is inherent to the PML2 or comparable prior art exposure strategy, delay times with respect to switching of beamlets automatically lead to a virtual placement error of the beamlets, independent on the position of the respective aperture on the multi-aperture plate. In any realization of PML2 it is very difficult to achieve the required timing precision of all beam-lets in the range <0.1 ns.

Such a virtual placement error may appear in the image as an additional (non-isotropic) contribution to the blur, or as distortion of parts of the pattern imaged to the substrate.

Even if the timing of the switching is arranged to be "perfect", it will be unavoidable that the signal edges have finite slope, giving rise to, in particular, finite times of switching "on" and "off" during which the state of the electrostatic potential of the deflection electrodes (part of the pattern definition means) is not accurately defined. The rising and falling signal edges, among other effects, results from the capacity of the CMOS electronics and the MEMS arrangement and depends on parameters like the choice of dielectrics of the deflection electrodes and its surrounding elements. As an undefined state of the beam during the switching event may lead to an undesired background dose or to a drift of the respective beam-let, in the state-of-the-art concept the effective signal rise and fall time has to be kept very small (e.g. <1% of the total time when the beam-let is "on" per clock signal). In consideration of the increased power consumption of the CMOS electronics related to the switching speed ($P=I^2 \cdot R$) and the limited thermal conductivity of the CMOS structure in the membrane-like multi-aperture plate, this requirement can be fulfilled only at low toggling rates which appear to be too small for realistic throughput rates.

Due to the data reloading process connected to switching of the beamlets electromagnetic disturbances may occur which may interfere with the beam passing the pattern definition device. The smaller the signal edge times, the higher is the disturbance due to reloading.

Another problem occurring in PML2 or other prior art is that gray level dose control is achieved primarily by programming of the data stream controlling the pattern definition device. The allowed error of the gray level dose is typically smaller than 1% of the nominal dose in order to fulfill critical dimension requirements. Any change of the deposited dose, for example a sudden increase of brightness of the source by a few percent, a change in the secondary dose such as backscattering or fogging, or an altered contrast behavior (=sensitivity), needs to be taken into account in real time. If data preparation is done once before the exposure and no dynamic control of the total dose is possible as in prior art, such effects give rise to errors in critical dimension and placement of the (lithographic) patterns.

Another critical issue is the essential synchronization between stage position (or relative position of beam with respect to substrate) and the signal timing in the pattern definition device. A delay of one with respect to the other will have the detrimental effect that the projected image of the pattern definition device is distorted along the scanning motion and misplaced with respect to the layout design grid and previous layers (overlay error). Hence, in prior art either the toggling rate has to be adjusted to fit the stage velocity, or vice versa, both requiring a very precise and fast control of the respective control parameters. Particularly in the phases where the velocity of the inert stage is not perfectly settled, e.g. near the turn around events, the synchronization requirement is critical.

Another problem occurring in PML2 or other prior art is that due to the unique PML2 scanning stripe exposure strategy the dose transferred to the substrate is proportional to the toggling rate. Therefore, near turn around events, where the stage speed has to be reduced, either the gray levels in these regions have to be adjusted, or additional scanning time has to be accepted by selecting a longer scanning path. The first would mean an unwanted dependency between data preparation and the mechanical properties of the scanner, the second would give rise to a significant throughput reduction, depending on the achievable acceleration and jerk of the mechanical scanner system.

Another problem of PML2 or other prior art relates to thermal management. At the position where the deflected beamlets (e.g. generated by a micro-deflector as part of the pattern definition device) are stopped, a very high power density may be generated. In an arbitrary exposure typically 50% of the beamlets are blanked by the pattern definition device, giving rise to a persistent significant heat transfer to the surface where the blanked-out beam parts are absorbed. In general an absorber plate, having a small central opening surrounded by a surface adapted to absorb beam parts that are blanked out from the passage through the central opening, is located near a cross-over of the beam, where the current density is very high. Therefore, with increasing beam current the absorbing surface will tend towards surface melting as consequence of local overheating.

SUMMARY OF THE INVENTION

The present invention is a charged-particle exposure apparatus of the type as described in the beginning wherein the illuminating system further comprises a 'common' deflector means adapted to vary the direction of incidence of the illuminating beam upon the pattern definition means from a primary incidence axis (which usually is the optical axis of the lithography apparatus, or specifically the illuminating system, but may be another suitable direction in general), and the projection optics system comprises a blocking aperture means having an opening and being adapted to block passage of beams traversing outside said opening.

Due to the adjustment of the angle of impingement of the illuminating beam it is possible not only to provide a simple solution for blanking out the entire beam whenever needed, but also other improvements such as:
  improved precision of the global timing of the individual beamlets (with respect to the switching and the position of the rapidly moving substrate);
  variable control of exposure dose per area ("dose leveling" by pulse width modulation) that is transferred to the substrate at variable illumination conditions (the current of the source might vary by a few percent with time, whereas the stage shall move at the same (constant) speed all the time);
  avoidance of disturbing effects upon the beam (or beamlets) due to variable electrostatic or magnetic fields inside the blanking aperture plate;
  increased tolerance with respect to signal rise and signal fall times due to capacitive or inductive delays during the switching events inside the blanking aperture plate;
  relaxed heat load (as well as sputter effects in case of ions) generated at the position of the absorber plate, the heat being distributed on a larger area;
  ability to correct for variations in beam intensity and scanning speed (table velocity), in particular to correct for acceleration/deceleration during the turn-around phases of the stage movement at the edge of the wafer area.

The reason for putting the common deflector in front of the PD system and put the PD system near or at the position of the object plane of the projection system is that, in first order, energizing the common deflector causes only a tilt of the illuminating beam and does not lead to any drift of the projected image on the wafer while the total beam is displaced from the center and finally intercepted by the blocking aperture means at the position of or near the crossover(s) between PD system and substrate.

Preferably, the deflector means is adapted to deflect the illuminating beam, i.e., vary the direction of incidence of the illuminating beam, by up to 5 mrad from the primary incidence (or optical) axis.

In one preferred embodiment, in order to avoid overly irradiating the region of the blocking aperture means where the focused beam impinges, the common deflector is adapted to vary the direction of incidence of the illuminating beam to varying directions around the primary incidence (optical) axis. It will thus divert the beam to varying directions such that the position where the beam impinges upon the blocking aperture means varies with time. For instance, by virtue of the varying diversion effected by the common deflector that position may move around the opening of the blocking aperture means. This measure results in exposing varying surface portions of the blocking aperture means to portions of the particle beam that are diverted from its undisturbed path. By this measure, the irradiation and heat load imparted by the beam is distributed over an increased surface and cooling is facilitated.

A control means may be present which is adapted to generate a common blanking control signal for said deflector means which, as a function of time, switches between two states, namely, a first state wherein the illuminating beam propagates to the pattern definition device along the direction of incidence axis (for example by deactivation of the deflector so as to not affect the propagation of the illuminating beam at all) ("common blank-in") and a second state wherein the deflector means is activated to deflect the illuminating beam by a minimum angle sufficient to direct the path of the beam off the opening of the blocking aperture means blocking the entire beam ("common blank-out"). The switching between these two kinds of states helps controlling the process of loading and imaging of pattern data in the PD device.

For one example of an application of the common blanking control signal, the common blanking control signal can be synchronized with at least one control signal controlling validity of pattern information represented within the pattern definition means. In particular, the frequency at which the deflector is activated is at least the same as the toggling rate (refresh rate) of the pattern in the PD device. Thus, it is possible to activate (blank-in) the beam only for those times when a pattern in the PD device is present and stable, but blank out the beam during, for instance, the process of loading a pattern into the PD device which may cause the individual beamlet deflectors to assume transitional states.

In another example the control means may synchronize the common blanking control signal with a scanning movement of the image over the target on which the image is formed, said scanning movement comprising first time intervals wherein the position of the image is stabilized onto nominal positions of the target and second time intervals wherein the image would move over the target, said common blanking control signal controlling the deflector means for a common blank-in within said first time intervals. A further example of an application of the control means and the common blanking control signal envisages controlling a pulse length of the common blanking control signal for scaling the exposure dose produced by the beam on the target, for fine tuning of the exposure dose in conjunction with other exposure parameters such as the duration of frame exposure or speed of the target station. Yet another example is the use of the control signal for a time delay of the common blanking control signal for fine controlling the placement of beam image produced on the target.

Furthermore, it is advantageous when the pattern definition means, in particular the plate containing the micro deflectors, is positioned at the position of an objective plane of the projection optics system, in order to avoid placement errors of the projected image during blanking with the common deflector means.

In order to provide an efficient yet simple way of blocking deflected parts of the beam, the blocking aperture means is preferably located positioned at or near (i.e. within the range where the lateral restriction of the beam is smaller than the lateral displacement of beam deflection imparted by the common deflector means) to the position a crossover of the beam defined by the projection optics system.

Advantageously, the blocking aperture means is adapted to block passage of beam portions arising from the illuminating beam being deflected from the primary incidence axis by the deflector means by more than a minimum angle. The minimum angle corresponds to the width of the aperture of the aperture blocking means in relation to the spatial offset of the beam at the position of the aperture when the beam is deflected. In one preferred embodiment, more than one blocking aperture means may be provided; then a second blocking aperture means may be adapted to block passage of beam portions arising from the beam being deflected by at least one of the beamlet deflectors of the pattern definition means. Alternatively, the same blocking aperture means may be adapted to also block passage of beam portions arising from the beam being deflected by at least one of the beamlet deflectors of the pattern definition means.

BRIEF DESCRIPTION OF THE DRAWINGS

In the following, the present invention is described in more detail with reference to a preferred embodiment illustrated in the drawings schematically:

FIG. 2 shows a plan view of the aperture arrangement in a pattern definition device of the lithography apparatus of FIG. 1;

FIGS. 3 and FIG. 3a illustrate an image field as present on a substrate surface in the lithography apparatus of FIG. 1;

DETAILED DESCRIPTION OF THE INVENTION

The preferred embodiment discussed in the following is based on the pattern definition (PD) system disclosed in the U.S. Pat. No. 6,768,125 and GB 2408 383 A, and the teachings of both these documents with regard to the architecture and operation of the PD device, and in particular the architecture of its blanking plate, are incorporated by reference herein. In the following, the technical background of the PD system, as far as relevant to the invention, is first discussed with reference to FIGS. 1 to 6 (which were taken, with modifications where appropriate, from the mentioned patent documents), then the preferred embodiment of the invention is illustrated in the additional Figures. It should be appreciated that the invention is not restricted to the embodiment discussed in the following, which merely represents one of the possible implementations of the invention.

Figure 1:
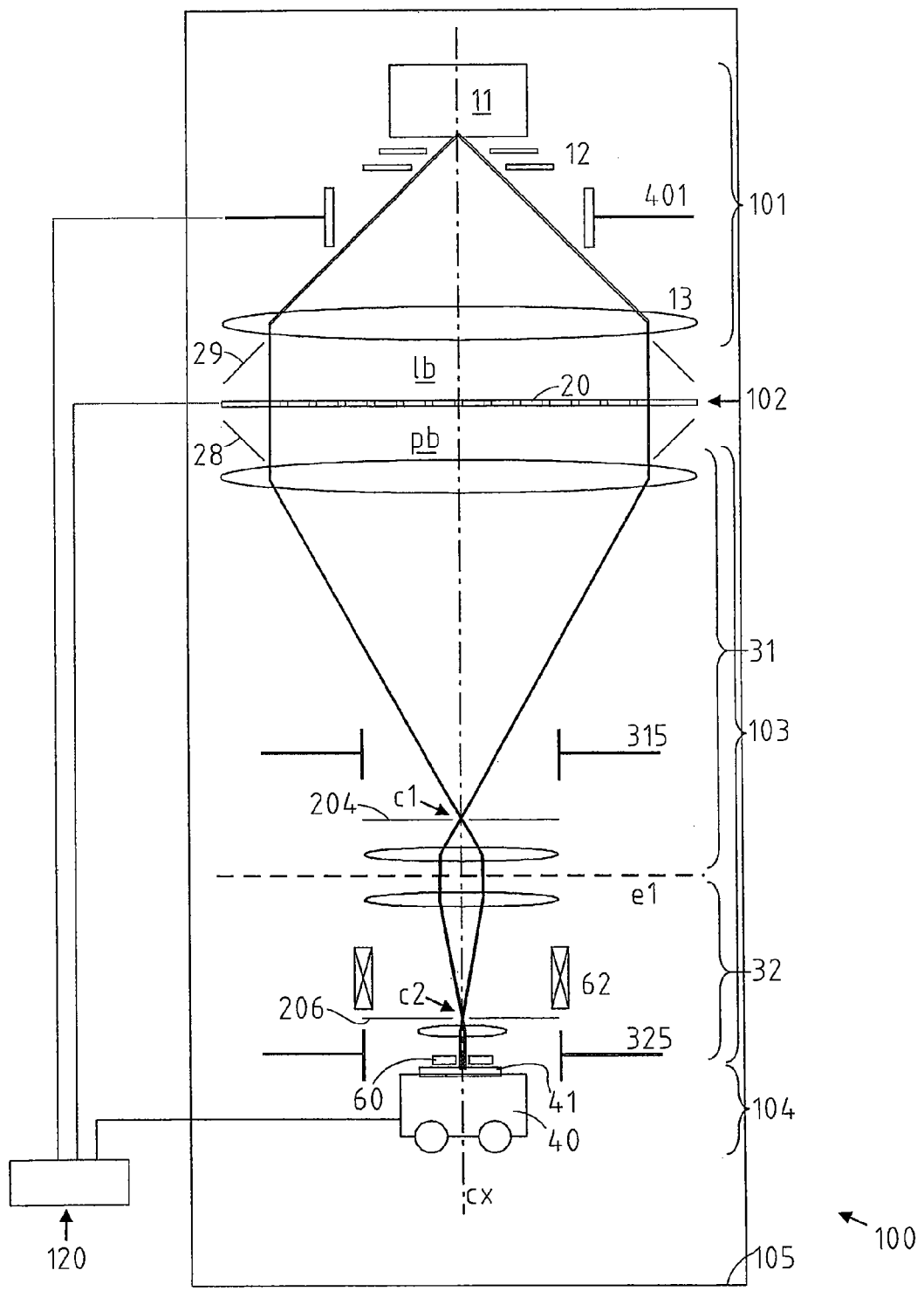
FIG. 1 shows a longitudinal section of a layout of a lithography apparatus to which the invention applies.

FIG. 1 shows an overview of a lithographic apparatus on which the invention is based. In the following, only those details are given as needed to disclose the invention; for the sake of clarity, the components are not shown to size in FIG. 1. The main components of the lithography apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons these can be, for instance, ions such as hydrogen ions or heavier ions.

The extraction system 12 accelerates the particles to a defined energy of typically several keV, e.g. 10 keV. By means of a condenser lens system 13, the particles emitted from the source 11 are formed into a wide, substantially telecentric particle beam serving as lithography beam lb. The lithography beam lb then irradiates a PD device 20 which, together with the devices needed to keep its position (see below, FIGS. 9 and 10 below), form the PD system 102. In the preferred embodiment as discussed here, the lithography beam irradiates the PD device at a direction of incidence which is the optical axis cx of the illumination system and the central axis of the PD device. The PD device 20 is held at a specific position in the path of the lithography beam lb, which thus irradiates a plurality of apertures 21 (see FIG. 2). Some of the apertures are "switched on" or "open" such that they are effectively transparent to the incident beam and the resulting beamlet can reach the target; the other apertures are "switched off" or "closed", i.e. the system is non-transparent (opaque) to that portions of the beam. The non-transparency for the beamlets is attained by deflecting them off from their respective primary paths, so they impinge on some absorbing surface provided within the PD device or between the PD device and the target, such as one of the blocking apertures 204,206. The pattern of switched-on apertures is chosen according to the pattern to be exposed on the substrate, as these apertures are the only portions of the system transparent to the beam 1b.

Thus the beam is formed into a patterned beam pb emerging from the apertures (in FIG. 1, below the device 20).

The pattern as represented by the patterned beam pb is then projected by means of an electro-magneto-optical projection system 103 onto the substrate 41 where an image of the switched-on mask apertures 21 is formed. As already mentioned, the beamlets of the switched-off apertures are blocked out by means of an absorbing surface before they can reach the target. The projection system 103 implements a demagnification of, for instance, 200× with two crossovers c1, c2. The substrate 41 is, for instance, a silicon wafer covered with a photo-resist layer. The wafer 41 is held and positioned by a wafer stage 40 of the target station 104.

The apparatus 100 may further comprise an alignment system 60, which allows to stabilize the position of the image of the mask apertures (image field mf, FIG. 3) on the substrate with respect to the particle-optical system by means of reference beams which are formed in the PD system by reference marks 26 at the side of the PD field pf (FIG. 2); the principles of an alignment system are described in the U.S. Pat. No. 4,967,088. For instance, correction of image position and distortion can be done by means of a multipole electrode 315, 325; additionally, a magnetic coil 62 can be used to generate a rotation of the pattern in the substrate plane.

In the embodiment of the invention shown in FIG. 1, the projection system 103 is composed of two consecutive electro-magneto-optical projector stages 31, 32. The lenses used to realize the projectors 31, 32 are shown in FIG. 1 in symbolic form only, as technical realizations of particle imaging systems are well known in the prior art, such as, for instance, the U.S. Pat. No. 4,985,634 (=EP 0 344 646) of the applicant. The first projector stage 31 images the plane of the apertures of the device 20 into an intermediate plane e1 which in turn is imaged onto the substrate surface by means of the second projector stage 32. Both stages 31, 32 employ a demagnifying imaging through crossovers c1, c2. The demagnification factor for both stages is chosen such that an overall demagnification of several hundred results, e.g. 200×. A demagnification of this order is in particular suitable with a lithography setup, in order to alleviate problems of miniaturization in the PD device.

In both projector stages the respective lens system is well compensated with respect to chromatic and geometric aberrations; furthermore, a residual chromatic aberration of the first stage 31 can be compensated by suitable fine correction of the electrode potentials in the second stage 32.

As a means to shift the image laterally as a whole, i.e. along a direction perpendicular to the optical axis cx, deflection means 315, 325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system.

FIG. 2 shows a plan view of the arrangement of apertures in the PD device 20. A plurality of square-shaped apertures 21 is provided which are arranged within a PD field pf in a regular array in which the apertures 21 are aligned along adjacent lines pl, wherein in each of the lines pl the same number of apertures is present. Seen along the direction perpendicular to the lines pl, the apertures form a sequence of rows r1, r2, r3; in the embodiment shown, the rows r1-r3 are not adjacent but spaced apart. The apertures are arranged within the PD field pf according to a skewed regular arrangement such that the apertures of every third row align (n=3) as the pitch pn between neighboring rows is three times the width w of an aperture (i.e., pn=n×w), and the offset pm between neighboring rows is 4 times the width of an aperture (i.e., pm=m×w with m=4). Within a line pl, the offset of apertures is n·pm=12. Thus, the apertures cover only 1/(n×m)=1/12 of the area of the field pf and, at a time, only one out of n×m=12 image elements can be exposed as shown in FIG. 3; the other elements are exposed in subsequent steps by means of moving the substrate along the "scanning direction" sd relative to the image of the apertures. FIG. 3 illustrates the image field mf produced on the substrate; for the sake of clarity it is assumed that all apertures are switched on in this figure. The width fw of the image field is the width L (FIG. 2) of the PD field pf reduced by the demagnification factor of the projection system. The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. FIG. 3a illustrates the exposure of pixels in subsequent positions of the motion of the substrate through the possible 12 (=n×m) positions; the pixels are accordingly referenced with letters a to l (the pixels shown hatched are position a). The whole image field mf is moved over the surface of the photoresist-covered wafer serving as substrate 41 so as to cover the total area of the substrate surface. In the example discussed here, the minimum feature size shall be 50 nm, and the smallest spot to be illuminated on the wafer, here defined as the pixel width x, is 25 nm. The image field width fw is 300 μm; in order to produce this image field in connection with a 200× demagnification projection system (see above), the square-shaped PD field has a width L=60 mm. Consequently the number of lines pl is L/w=12000, and 12000 bit streams are to be addressed by the incoming data stream. In the direction across, there are fw/(n·x)=L/(n·w) =4000 apertures in each of the rows r1-r3.

Figure 4:
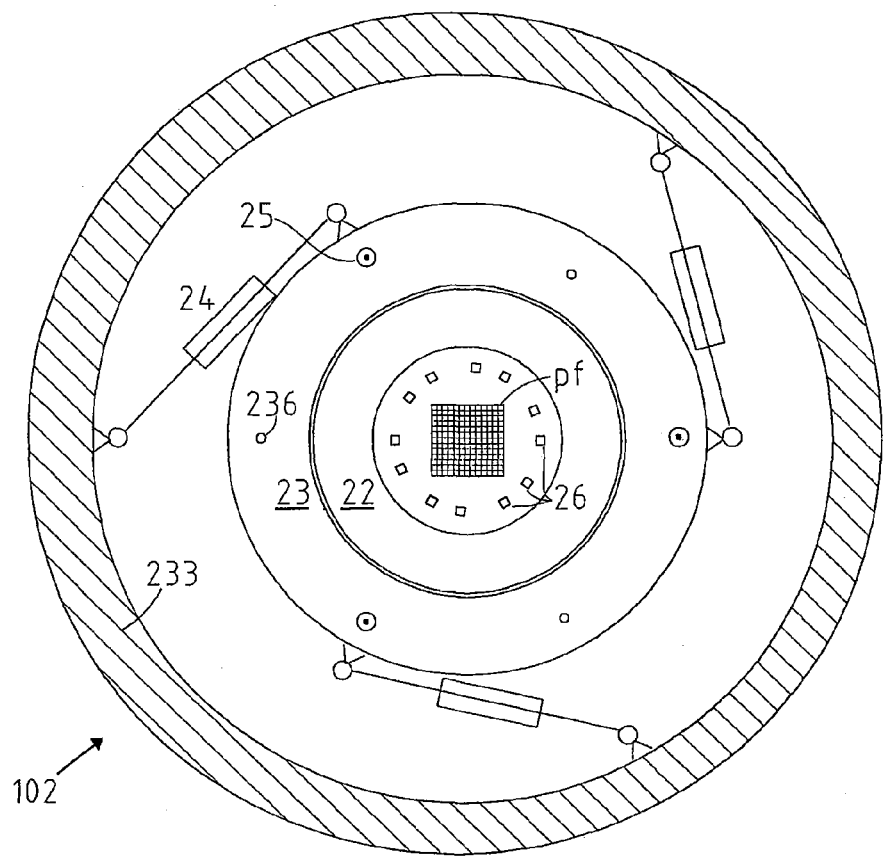
FIGS. 4 and 5 show the pattern definition device of the lithography apparatus of FIG. 1 in a top view (FIG. 4) and a longitudinal section (FIG. 5), including a first adjustment unit according to the invention, positioned in front of the blanking means at a distance before the aperture array.
Figure 5:
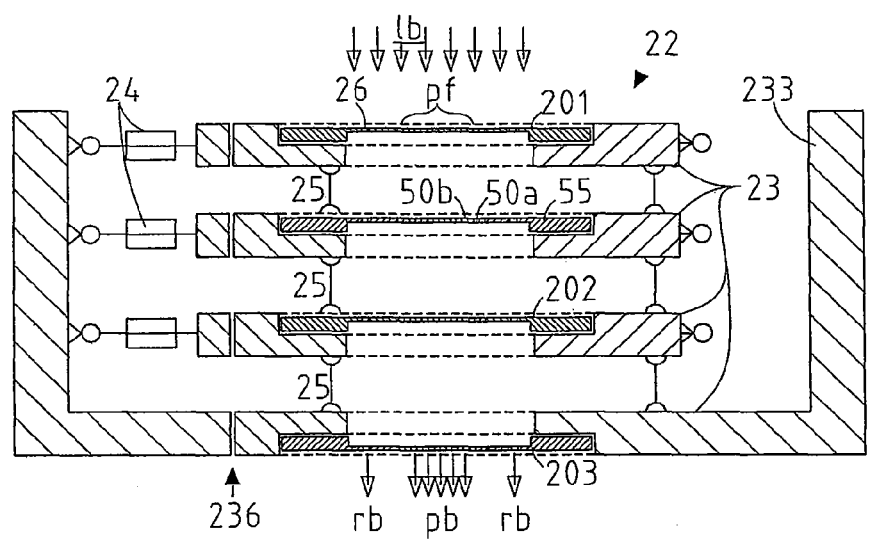
Figure 6:
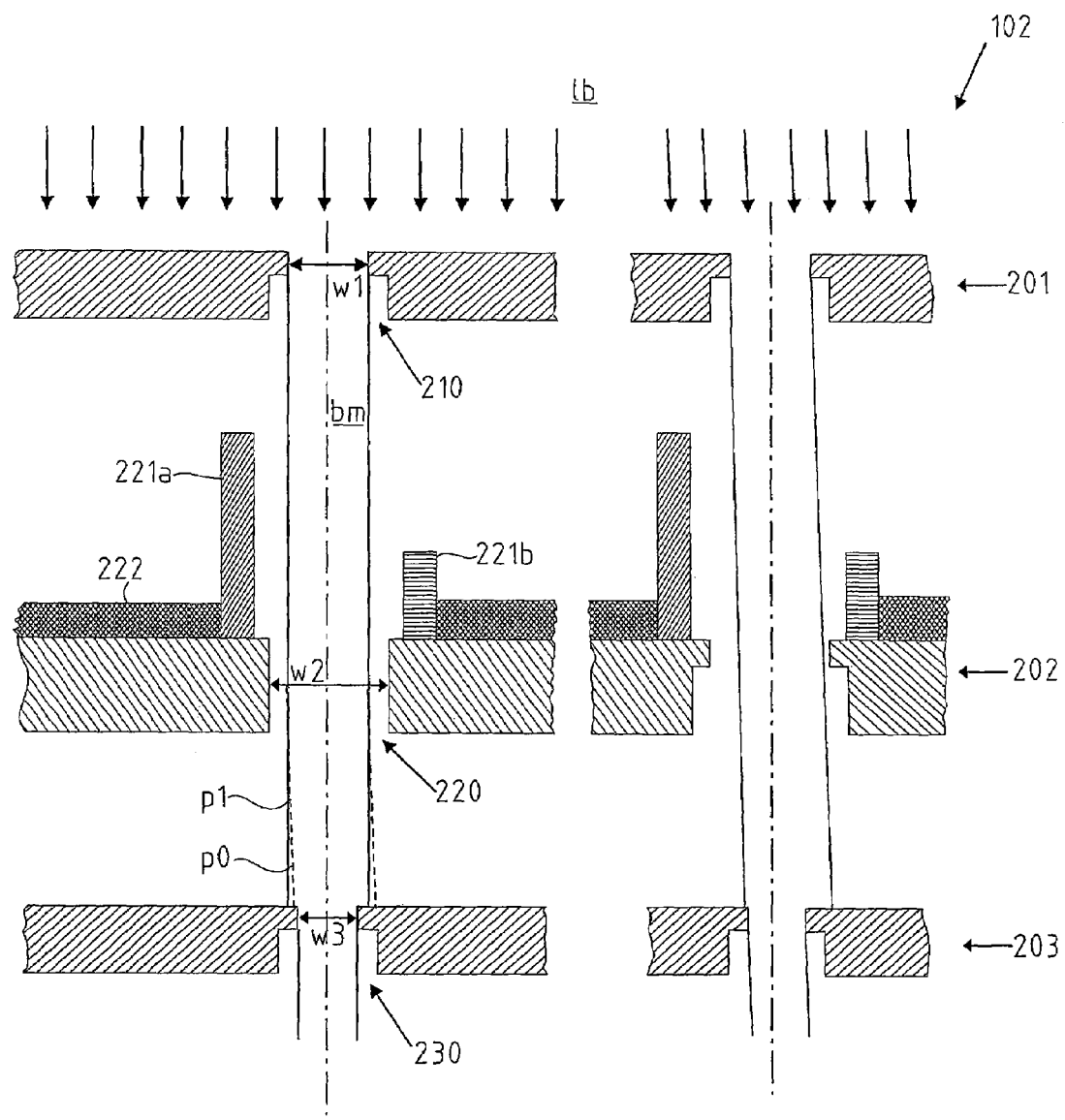
FIG. 6 represents a detail of FIG. 5 along two apertures, depicting the formation and definition of beamlets for the two situations of an undeflected illuminating beam and an illuminating beam deflected according to the invention, respectively.

FIGS. 4 and 5 show the PD system 102 of the apparatus 100, namely, in FIG. 4 a top view and in FIG. 5 a longitudinal-sectional view. FIG. 6 shows a detail of FIG. 5, a section of the plates of the PD system 102 along one aperture. The PD system 102 comprises a number of plates 22 mounted in a stacked configuration, realizing a composite device whose components serve respective functions, including for instance a cover plate 201, a blanking plate 202, and an aperture plate 203. Further component plates may also be present, such as an adjustment unit for individual fine adjustment of the beamlet paths (not shown here, cf. U.S. Pat. No. 6,768,125). Each of the plates 22 is realized as a semiconductor (in particular silicon) wafer in which the structures were formed by microstructuring techniques known in the art. The lithography beam traverses the plates through an array of apertures in the PD field pf (FIG. 5). Each aperture corresponds to a set of openings 210, 220, 230 which are defined in the plates 22 (FIG. 6). Further details of the plate stack, in particular components 23, 24, 25, 233, 236, 50a, 50b and the reference beamlets rb, are discussed in U.S. Pat. No. 6,768, 125, which is incorporated by reference herein.

The thickness of each of the plates 22 is about 100 μm; their mutual distance is in the order of 100 μm to 1 mm. It should be noted that in FIGS. 5 and 6, the dimensions in the longitudinal axis (z-axis parallel to the optical axis of the apparatus) are enlarged and not to scale.

The blanking of the beamlets is controlled by means of a blanking means realized as a blanking plate 202 which comprises an array of openings 220, each corresponding to an aperture. Each opening 220 comprises a set of beam blanking electrodes 221a,221b as well as the circuitry 222 for controlling the electrodes 221a,221b, which are accommodated, for instance, in the upper surface layer of the blanking plate 202. The blanking electrodes 221a,221b, serving as aperture deflection plates as described below, are formed in the blanking openings by perpendicular growth employing state-of-the-art techniques. More details about the layout of the blanking plate 202 and its circuitry 222 can be found in the U.S. Pat. No. 6,768,125.

In front of the blanking plate 202, as seen in the direction of the lithography beam, a cover means realized as a cover plate 201 is provided in order to protect the blanking plate 202, in particular the circuitry 222, from irradiation damage. The cover plate 201 takes up the majority of the impingent lithography beam lb; the particles can only pass through the openings 210, formed in an array corresponding to that of the blanking plate, which openings make up only a small fraction of the total area of the PD field pf. For instance, with an irradiation density of 4 µA/cm$^2$ of electrons of 10 keV, the heat load to the cover plate is approximately 40 mW/cm$^2$. This heat input is compensated by thermal radiation from its surface (in conjunction with cooling elements 29,28 located in front of and after the PD system, cf. FIG. 1) and by heat flow through the bulk material of the cover plate. More details about the layout of the cover plate 201 can be found in the U.S. Pat. No. 6,768,125.

The width w2 of the opening 220 in the blanking plate 202 is greater than the width w1 of the opening 210 in the cover plate 201, so the beamlet bm defined by the latter opening will pass through the former opening without affecting the controlling circuitry 222 on the blanking plate 202. For instance, the width w2 can be 7 µm (as compared to the defining width of the aperture of w=5 µm).

The PD system 102 further comprises an aperture array means which serves to define the beamlet laterally. Here, the aperture array means is realized as an aperture plate 203 with an array of openings having a width w3, positioned after the cover and blanking plates 201, 202. More details about the layout of the aperture plate 203 can be found in the U.S. Pat. No. 6,768,125.

It is the aperture 230 of width w3 (rather than the initial opening in the cover plate 201) which defines the lateral shape of the beamlet emerging from the system 102 (corresponding to the width w of an aperture in FIG. 2). Therefore, the term 'aperture', when used in relation to the definition of a pattern to be produced on the target, is reserved to the openings of defined shape and width w (FIG. 2) as defined by the beamlet-defining apertures 230.

The beamlet bm transgresses the subsequent openings of the plates 22 along the path p1 provided the blanking electrodes 221a, 221b are not energized; this corresponds to the "switched-on" state of the aperture. A "switched-off" aperture is realized by energizing the electrodes, applying a transverse voltage. In this state, the blanking electrodes 221a, 221b deflect the beamlet bm off the path p1 so the beamlet is deflected to a different path p0 which eventually leads to some absorbing surface, preferably on an blocking aperture 204, 206 (FIG. 1) located around of one of the crossovers c1, c2.

According to the invention a common beam deflector 401 is provided at a position before the PD system 102, thus forming a component of the illuminating system. The common beam deflector 401 serves to introduce a (small but sufficient) deviation of the angle of incidence of the particle beam upon the PD device from a primary (non-deflected) direction, which in the preferred embodiment is the optical axis cx, and combines with an absorbing plate 204 positioned after the BAA in order to enable a global blanking of all beamlets penetrating the PD system in their entirety by energizing the common deflector (global switching "on" and "off"). A control means 120 is provided for controlling the common beam deflector 401 as well as coordinating it with other components.

The effective exposure time of each of the plurality of beamlets and the synchronization of all exposures with respect to the moving wafer can be controlled by a single signal triggering the common beam deflector. In order to avoid placement errors of the projected image of the PD system during blanking with the common deflector, the PD device is placed at the position of, or near to, the objective plane of the projection system, so that small angular deflections of the beams caused by energizing the common beam deflector do not lead to any drift of the image (in first order) on the wafer until the beam is absorbed by the absorber plate.

Figure 7A:
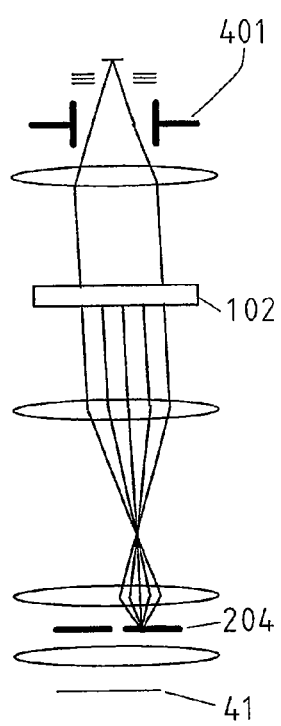
FIGS. 7a-7c illustrate the working principle of the common beam deflector according to the invention at three different stages of operation.
Figure 7B:
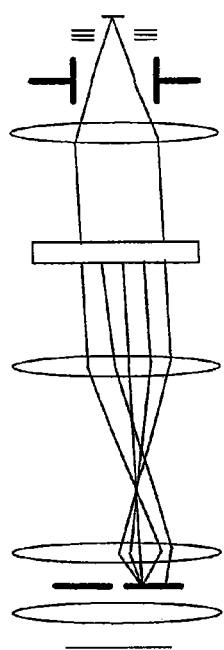
Figure 7C:
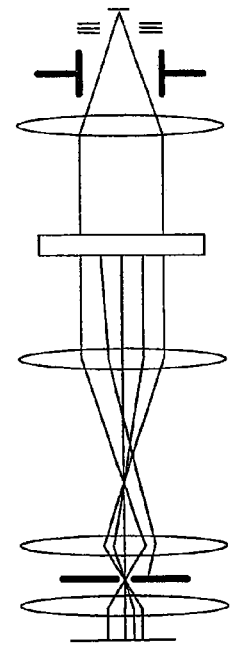

FIGS. 7a-7b show three instances of the exposure device at different times of operation. In FIG. 7a, the common beam deflector 401 tilts all beams uniformly, so all beams are blanked out and absorbed at an absorber plate 204. The plate 204 is preferably positioned at or near to the position one of the crossovers c1, c2. In FIG. 7b, the PD system 102 is loaded with pattern data which causes some of the beamlets to be deflected (i.e., switched off; one such beamlet is shown in FIG. 7b), the remaining beamlets keep their original paths. In FIG. 7c the common beam deflector is deactivated causing the complete patterned beam to be tilted back into the optical axis. Thus, only the individual beamlets deflected in the PD system are now blanked out at the absorbing plate 204; the other beamlets follow the primary path and reach the target 41.

The longitudinal extension of the PD system, in particular the distance between the first and last plates 22, ('longitudinal' means measured along the direction of the optical axis cx at the PD system) is sufficiently small so the beam is not affected inside the PD system while the beam penetrates at slightly deflected angle due to the common beam deflector. This is illustrated in FIG. 6: the left-hand portion of FIG. 6 shows the situation of a non-deflected illuminating beam, whereas in the right-hand portion the effect of a deflection according to the invention is depicted (the angle of deflection is shown exaggerated). As can be seen, the effect of the deflection of the illuminating beam is similar to that of the deflection of an individual beamlet by an activated set of blanking electrodes, namely, the beamlet formed in the PD device is deviated off its path by an angle sufficient to effectively rule out that it can reach the target.

Figure 10A:
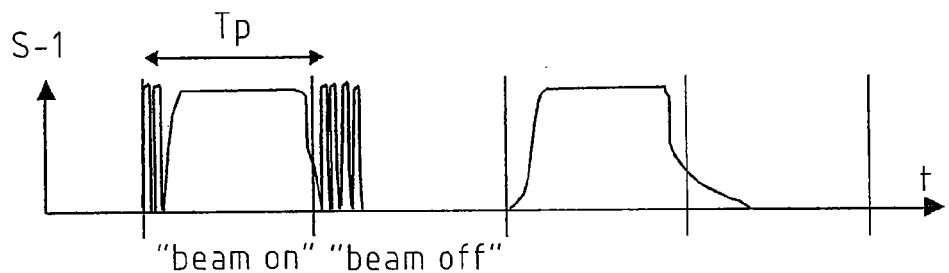
FIGS. 10a-10e illustrate several applications of the invention, namely, relating to blanking out during the intervals needed for pattern establishment in the PD system.
Figure 10B:
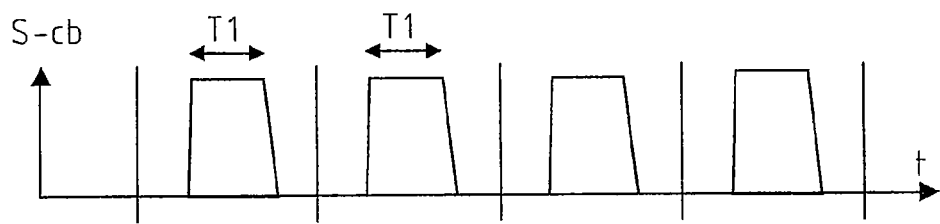
Figure 10C:
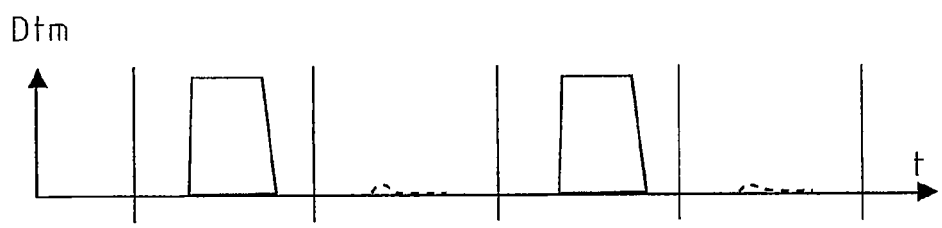

FIGS. 10a-10e illustrate one important use of the common beam deflector 401 according to the invention, namely, to enable to blank out the complete beam during those times where the signals applied to the blanking electrodes in the PD device are changing or unstable (for instance during the loading process of a pattern). FIGS. 10a-10e show examples of control signals as function of the time t, with vertical strokes marking time intervals Tp of exposing subsequent pixels. In FIG. 10a, the signal S-1 is an example of a signal applied to the blanking electrode set associated with one aperture. It corresponds to alternating sequence "1010" of activating (beamlet switched-on) and activating the electrodes (switched-off) since the control signal S-1 is negative logic. In FIG. 10b, the signal S-cb controls the common beam deflector and is high only during time intervals T1 which define time windows for each of the pixel time intervals Tp in which the blanking control signals (of which the signal S-1 is one representative) are stable. As can be seen, the basic frequency of switching inside the PD device (in particular, the blanking plate) is the same as the frequency of the common beam deflector, but the period of "beam on" is determined by the common blanker as this beam deflector has a shorter period. The resulting transmitted exposure signal $D_{tm}$ (FIG. 10c) is an effective AND-result of the two signals S-1 and S-cb and depicts the dose actually transmitted to the substrate by the aperture considered.

Due to the fact that the common beam blanker can be used to define the precise time of switching, small differences in the timing and time interval (between signal rise and fall) of the individual blanking control signals are acceptable. This is an important advantage as it allows imperfections in the signal timing and also individual differences of the capacitive behavior.

Figure 10D:
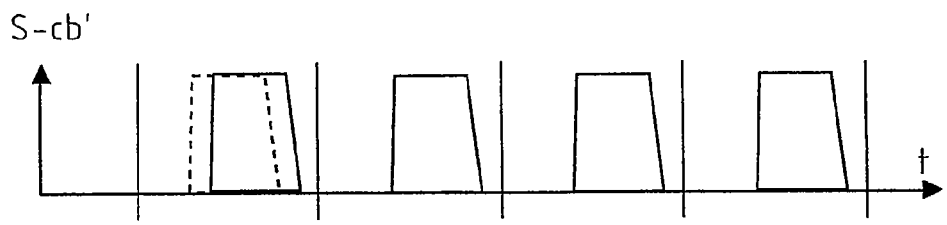
Figure 10E:
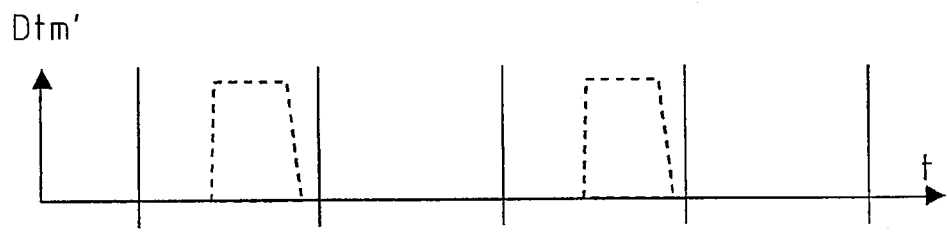

Similarly, the pattern fine placement of the image on the scanning wafer can be improved by a change in phase of the common blanker that causes a shift along the direction of the scanning beam. This is also shown in FIGS. 10d and 10e, with the variant signal S-cb' (FIG. 10d) and the resulting transmitted exposure signal $D_{tm}$'. As can be seen, the deflector signal S-cb' is shifted with respect to the original signal S-cb by a small time difference, causing a subtle time delay in the exposure signal. Typical changes are in the range of a fraction of the time interval T1. Since the target is moving under the impinging beamlet, such a time delay causes a small variation of the position of the pixel thus exposed.

Also the amount of dose produced on the target can be adjusted by variation of the length of the time interval T1. This may be done uniformly for all pixels, or a group of consecutive pixels, or individually for selected or consecutive pixels with the time interval length T1 chosen suitably.

Furthermore, the time intervals ('pauses') between adjacent intervals T1 can be used for loading a pattern into the PD device. This can be convenient for a simplified loading procedure for the apertures in the PD field pf, for instance, if only simple shift registers are used for holding the pattern information. In this case, a cycle like the following may be done:

activation of common beam deflector (S-cb goes low) to blank out the beam (start of a pause);

shifting of the data for all apertures through the lines of apertures until the data have reached the correct position; this loading process of the pattern data through the shift registers of the PD device may cause spurious oscillations of the signal S-1 as shown in FIG. 10 which are thus blanked out and, thus, the signal of the common deflector can provide rising and falling edges that are better defined for the signal control than the PD system is able to yield;

deactivation of common beam blanker (S-cb goes high) =start of interval T1; and holding the data during the time T1 of pixel exposure.

Figure 8A:
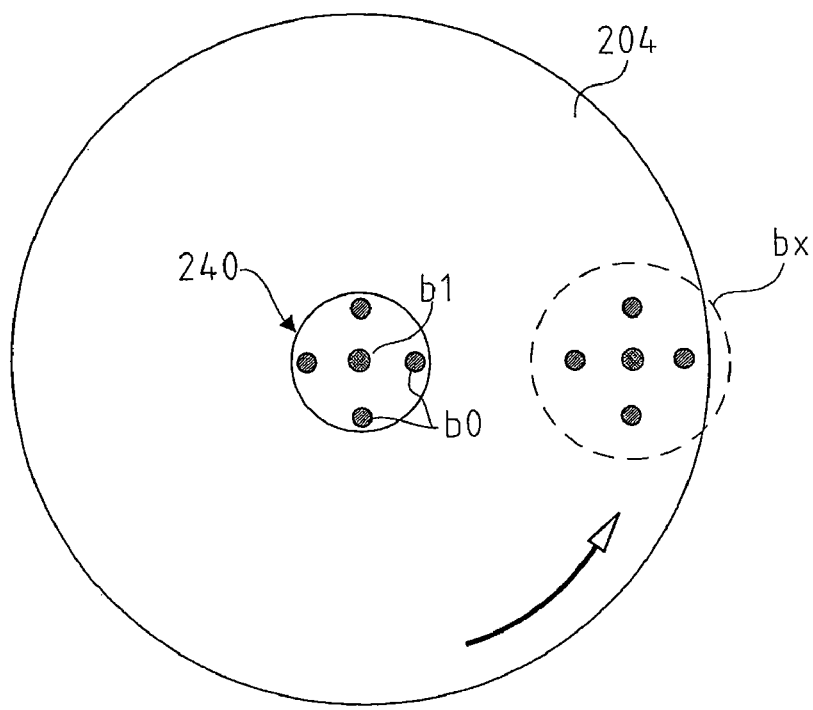
FIGS. 8a and 8b show plan views of the absorbing plates.
Figure 8B:
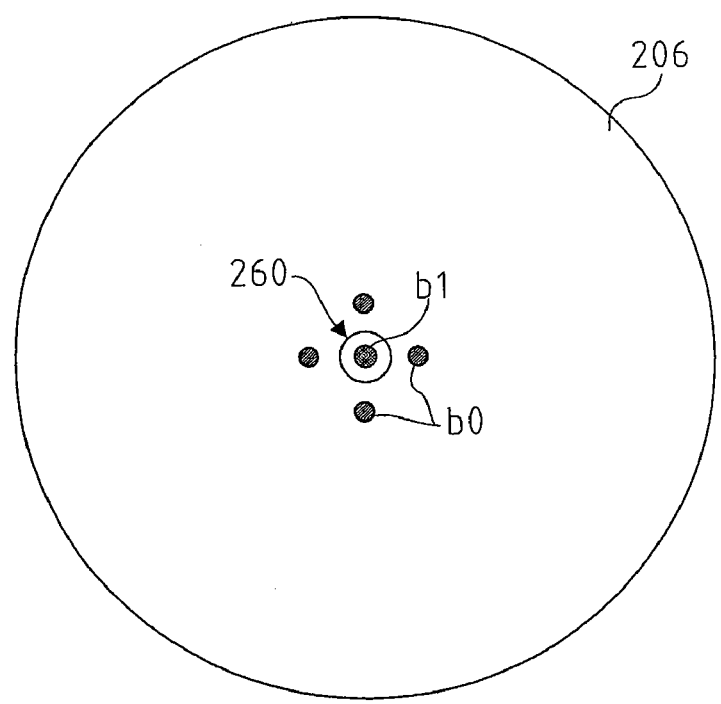

FIGS. 8a and 8b show plan views of the two absorbing plates 204, 206, respectively, which realize absorbing aperture means according to the invention, and the positions b1, b0, bx of the beamlets traversing the plane of the absorbing plate 204, and correspondingly for the second absorbing plate 206. The first absorber plate has an aperture with a radius chosen suitably such that it encompasses the complete set of approximate positions where the switched-on and switched-off beamlets (corresponding beam spots are denoted by hatched regions b1 and b0, respectively) traverses the plate, and at this position converge through the crossover c1. The aperture does not, however, extend to the region bx which denotes the place where the common beam deflector 401, when activated, moves the entire set of beamlets to. Thus, the beam deflected by the common deflector (bx) is absorbed by the first plate. Note that the direction of the common blanking need not coincide with a direction of individual blanking of the beamlets.

The second absorber plate has an aperture 260 whose width is chosen narrower, so it will absorb the "switched-off" beamlets b0 energized by the PD system micro-deflectors without energizing the common deflector (the switched-off beamlets b0 are deflected individually by the respective blanking electrodes which may differently oriented, and converge to confined spots at the location of the second crossover c2). By this the impact of heat load on the absorber plates can be reduced significantly.

Figure 9:
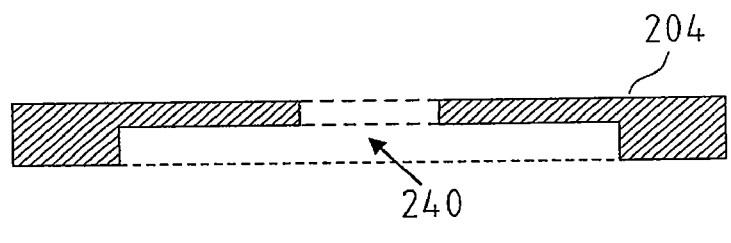
FIG. 9 shows a sectional view of one of the absorbing plates of FIG. 8.

FIG. 9 shows a sectional view of the absorbing plate 204. The thickness of the absorbing plate 204 is small around the central opening 240 to avoid any obstruction of the traversing beamlets while at the outer portions it may be thicker, in particular at those places where the beam is deflected by the common beam deflector (corresponding to the places bx of FIG. 8a).

Figure 12:
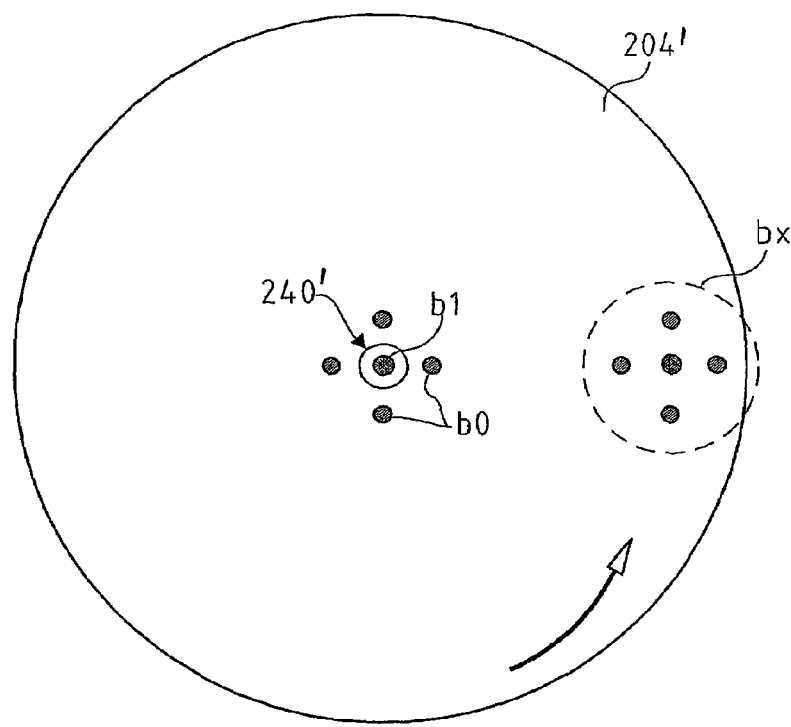
FIG. 12 shows a plan view of the single absorbing plate of a variant of the invention.

In a variant, the blocking of the beamlets may occur at the same absorbing plate 204', which is shown in FIG. 12. This plate 204' is preferably located at one of the crossovers c1, c2. When the common beam deflector is not active, the switched-on beamlets traverse the absorbing plate 204' through its opening 240', at an approximate position denoted as a hatched region b1. The diameter of the opening 240' is small but sufficiently large to allow the passage of the complete set of switched-on beams which at this position converge through the crossover. On the other hand, the switched-off beamlets (deflected individually by the respective blanking electrodes which may be differently oriented) impinge on regions b0 beside the opening 240' and thus are blocked off so they do not reach the target. Activation of the common beam deflector 401 moves the entire set of beamlets even more outward, for instance to places denoted as spots bx, where they are deflected as well.

Preferably, the position where the beam impinges upon the absorbing plate 204 (when it is deflected by the common deflector) may be continuously moved, e.g. in a rotating motion around the optical axis for at least those times when the beam is deflected by the common deflector, as symbolized by the arrow in FIG. 8a/12. This is achieved by varying the direction to which the irradiating beam is diverted by means of the common deflector to various angles or a sequence of angles, for instance describing a circle around the optical axis. Thus, the effective heat load on the absorber plate is considerably reduced. In general, the cross-over of the beam will be moved over a larger area than the diameter of the crossover, like in the instance shown along a circle concentrically to the opening of the absorber plate. In a variant, the absorbing plate can be a different type of aperture or iris, such as crossed slit apertures or a combination of knife edges, which together define a central opening surrounded by an absorbing area.

An alternative method of reducing the effective heat load is to provide a larger deflection of the plurality of all beams combined with an additional aberration of the crossover in case of deflection, so that the power density at the position of the absorber plate is significantly reduced.

Another application of the invention is illustrated in FIG. 11, relating to stabilizing of the image position on the substrate during a scanning sweep motion. This application refers to a medium to high through-put exposure process wherein the beam is moved continuously over the substrate along a certain path (like, e.g., the 'boustrophedonal' path shown in U.S. Pat. No. 6,768,125). Assuming that the scanning exposure covers a sequence of linear stripes, the scanning motion within each stripe is continuous along a straight line. The beam motion is achieved, for example, by a mechanical continuous scanning motion of the stage and/or additionally by an electrostatic scanning of the beam (using e.g. a variable axis lens). During the time of exposure of a pixel, the image of the apertures are deflected so as to keep the aperture images steady on their respective position on the target surface, i.e., fixed on a position of the respective target field. For that, the deflection system may adjust the position of the image according to a saw-tooth motion which the deflectors impose on the particle beam. The ramps (continuous rising flanks of the saw-tooth) thus compensate the overall scanning motion of the beam across the target; between these continuous parts, the saw tooth "jumps back" to redirect the image to the position of the next frame of a target field which, by then, has taken the position of the original frame (cf. U.S. Pat. No. 6,768,125).

Without such a saw-tooth correction, due to the finite exposure times and the relative velocity of the geometric images of the apertures moved along the substrate, the resulting dose distribution would be elongated (or smeared) along the direction of the velocity and neighboring positions on the wafer would not be sufficiently separated. By means of the correction the beam is "locked" on the substrate during the duration of a single exposure by moving the beam with the same velocity as the substrate.

Figure 11A:
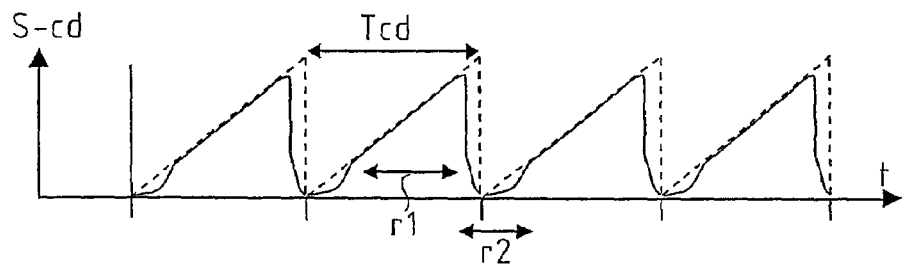
FIGS. 11a-11b illustrate another application of the invention relating to stabilizing of the image position on the substrate during a scanning sweep motion.

The upper signal diagram of FIG. 11a displays the saw-tooth voltage signal S-cd for the correction deflectors as a function of time t. As can be seen, the signal largely follows an ideal saw-tooth (e.g., having a period Tcd of appr. 25 to 1000 ns) but deviates at the beginning an end of each ramping interval. An ideal deflection voltage (shown dashed) would provide a constant slope for the ramp during each exposure, with a discontinuity once per toggling event, when the position has to jump back; in reality, due to effects such as capacitive or inductive damping, timing errors, signal deformation, the saw-tooth signal has an onset time at the beginning of each ramp and a falling edge with high but finite (negative) slope for the "jump-back", leaving a somewhat reduced ramp interval r1 having a sufficiently uniform slope.

Figure 11B:

By means of a common blanker signal S-cbt, shown in the lower signal diagram of FIG. 11b, the entire particle beam is blanked out for a time interval r2 from the end of each ramp interval r1 until the beginning of the subsequent interval when the voltage signal S-cd has stabilized. Thus, the present invention allows to select the precise time period and phase (corresponding to the time interval r1 of FIG. 11) in which the linear behavior of the toggling correction is sufficient for the required resolution. A controller is used to synchronize the common blanker with the toggling correction signal.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

The invention claimed is:

1. A charged-particle exposure apparatus for exposure of a target with a beam of electrically charged particles, said apparatus comprising:
   an illumination system;
   a pattern definition means; and
   a projection optics system,
   the illumination system being adapted to produce the beam illuminating the pattern definition means,
   the pattern definition means being adapted to form the shape of the illuminating beam into a desired pattern, and
   the projection optics system being adapted to project an image of the beam shape defined in the pattern definition means onto the target,
   the pattern definition means comprising:
      a plurality of apertures adapted to shape the cross-section of the illuminating beam into a multitude of beamlets, by allowing the passage of the illuminating beam only through said plurality of apertures defining the shape of beamlets permeating said apertures, and
      a blanking means having a plurality of individual beamlet deflectors adapted to selectively divert the respective beamlets from respective nominal imaging paths,
   the illumination system comprising:
      a deflector means adapted to vary a direction of incidence of the illuminating beam upon the pattern definition means from a primary incidence axis,
   and the projection optics system comprising:
      a blocking aperture means (204) having an opening and being adapted to block passage of beams traversing outside said opening;
   the apparatus further comprising;
      control means adapted to generate a common blanking control signal for said deflector means which, as a function of time, switches between a first state wherein the illuminating beam propagates to the pattern definition means along the primary incidence axis (common blank-in) and a second state wherein the deflector means is activated to deflect the illuminating beam by a minimum angle sufficient to direct the path of the beam off the opening of the blocking aperture means blocking the entire beam.

2. The apparatus according to claim 1, wherein said deflector means is adapted to vary the direction of incidence of the illuminating beam by up to 5 mrad from the primary incidence axis.

3. The apparatus according to claim 1, wherein said deflector means is adapted to vary the direction of incidence of the illuminating beam to varying directions around the primary incidence axis.

4. The apparatus according to claim 1, wherein the common blanking control signal is synchronized with at least one control signal controlling validity of pattern information represented within the pattern definition means.

5. The apparatus according to claim 1, wherein the common blanking control signal is synchronized with a scanning movement of the image over the target on which the image is formed, said scanning movement comprising first time intervals wherein the position of the image is stabilized onto nominal positions of the target and second time intervals wherein the image would move over the target, said common blanking control signal controlling the deflector means for a common blank-in within said first time intervals.

6. The apparatus according to claim 1, wherein the control means is adapted to control a pulse length of the common blanking control signal for scaling the exposure dose produced by the beam on the target.

7. The apparatus according to claim 1, wherein the control means is adapted to control a time delay of the common blanking control signal for fine controlling the placement of beam image produced on the target.

8. The apparatus according to claim 1, wherein the pattern definition means is positioned at the position of an objective plane of the projection optics system.

9. The apparatus according to claim 1, wherein the blocking aperture means is located positioned at or near to the position a crossover of the beam defined by the projection optics system.

10. The apparatus according to claim 1, wherein the blocking aperture means is adapted to block passage of beam portions arising from the illuminating beam being deflected from the primary incidence axis by the deflector means by more than a minimum angle.

11. The apparatus according to claim 10, comprising a second blocking aperture means adapted to block passage of beam portions arising from the beam being deflected by at least one of the beamlet deflectors of the pattern definition means.

12. The apparatus according to claim 10, wherein the blocking aperture means is adapted to also block passage of beam portions arising from the beam being deflected by at least one of the beamlet deflectors of the pattern definition means.

13. The apparatus according to claim 1, wherein the primary incidence axis is the optical axis of the illumination system.

* * * * *